United States Patent [19]

Itano

[11] Patent Number: 5,638,323
[45] Date of Patent: Jun. 10, 1997

[54] NONVOLATILE SEMICONDUCTOR MEMORY USING TUNNEL EFFECT HAVING A CONTROL CIRCUIT FOR SIMULTANEOUSLY WRITING AND READING DATA OUT OF A PLURALITY OF MEMORY CELLS

[75] Inventor: Kiyoshi Itano, Kawasaki, Japan

[73] Assignee: Fujitsu Limited, Kawasaki, Japan

[21] Appl. No.: 431,297

[22] Filed: Apr. 28, 1995

[30] Foreign Application Priority Data

Jul. 7, 1994 [JP] Japan ..................... 6-155864

[51] Int. Cl.$^6$ .................................... G11C 7/00
[52] U.S. Cl. ................. 365/185.22; 365/189.04; 365/189.05
[58] Field of Search ............... 365/189.05, 185.21, 365/185.22, 185.03, 185.24, 189.04

[56] References Cited

U.S. PATENT DOCUMENTS 5,452,249  9/1995  Miyamoto et al. ............ 365/185.24
5,490,107  2/1996  Akaogi et al. ................ 365/185.22
5,490,110  2/1996  Sawada et al. ................ 365/185.03

FOREIGN PATENT DOCUMENTS

5-159586  6/1993  Japan .

Primary Examiner—David C. Nelms
Assistant Examiner—Michael T. Tran
Attorney, Agent, or Firm—Armstrong, Westerman, Hattori, McLeland & Naughton

[57] ABSTRACT

A nonvolatile semiconductor memory having a plurality of bit lines, a plurality of word lines, and a plurality of memory cells. Each of the memory cells is provided at each intersection of the bit lines and the word lines. The nonvolatile semiconductor memory includes a plurality of latch units provided for each corresponding bit line, and a control circuit. The control circuit is used to supply a control voltage and a control signal to the latch units, to operate the latch units as units for simultaneously biasing voltages applied to first electrodes of specified memory cells through the bit lines during a write operation, to simultaneously write data into the specified memory cells, and during a read operation, as units for simultaneously reading data out of the memory cells. This memory has an inexpensive simple structure for carrying out a simple programming operation at high speed.

17 Claims, 9 Drawing Sheets

NONVOLATILE SEMICONDUCTOR MEMORY USING TUNNEL EFFECT HAVING A CONTROL CIRCUIT FOR SIMULTANEOUSLY WRITING AND READING DATA OUT OF A PLURALITY OF MEMORY CELLS

BACKGROUND OF THE INVENTION

1. Field of the Invention

The present invention relates to a nonvolatile semiconductor memory, and more particularly, to a nonvolatile semiconductor memory using tunnel effect to write data therein.

2. Description of the Related Art

Flash memory is a kind of nonvolatile semiconductor memory which should have a low cost, consume low power, and simply perform a write operation at high speed. If these requirements are met, flash memory will be used as data memory in portable equipment or as a replacement for a magnetic disk.

One prior art flash memory writes data by injecting hot electrons into memory cells. The write speed of this flash memory is very high. It can write one byte of data within several microseconds. This flash memory, however, requires a current of several milliamperes to write a byte. When simultaneously writing a large quantity of data of, for example, several bytes, the flash memory requires a large power source capacity and has high power consumption.

Another flash memory writes data by using the tunnel effect. The write speed of this flash memory is low. It takes several milliseconds to write one byte of data. This flash memory, however, requires a current of only several tens of nanoamps (nano amperes) to write a byte. Accordingly, this flash memory is capable of simultaneously writing a large quantity of data while requiring little power.

The tunnel-effect flash memory usually writes data page-by-page and each page consists of, for example, 512 bytes. After writing data into a page, the conventional flash memory verifies the data in the page by reading the data byte by byte, which is time-consuming.

The tunnel-effect flash memory is described in, for example, IEDM (International Electron Devices Meeting) of 1992, Report No. 24-3-1 p. 599 and Report No. 24-7-1, p. 991.

The tunnel-effect flash memory writes data page-by-page with each page containing 512 bytes. It is necessary for the flash memory to equalize the threshold voltage Vth of each memory cell into which data has been written. To achieve this, a write operation and a verify operation are alternately repeated, in order to gradually strengthen the written state until the threshold voltage Vth is obtained. To speedily complete a write operation in the flash memory, it is important to shorten the verify operation after the write operation. It is also important to shorten the verify operation after an erase operation which is carried out before the write operation. The problems of the flash memory of the prior art will be explained in detail with reference to FIGS. 1A and 1B.

SUMMARY OF THE INVENTION

An object of the present invention is to provide a high-speed, low-cost, simple nonvolatile semiconductor memory that is easy to program or to write data into.

According to the present invention there is provided a nonvolatile semiconductor memory having a plurality of bit lines, a plurality of word lines, and a plurality of memory cells each provided at an intersection of each of the bit lines and each of the word lines. The memory comprises a plurality of latch units, each provided for a corresponding bit line; and a control circuit for supplying a control voltage and a control signal to the latch units, in order to operate the latch units as units for simultaneously biasing voltages applied to first electrodes of specified ones of the memory cells through the bit lines during a write operation, to simultaneously write data into the specified memory cells, and during a read operation, as units for simultaneously reading data out of the memory cells.

Each of the first electrodes of the specified memory cells may be a drain electrode of a memory cell transistor forming each of the memory cells. The control circuit may provide the control voltage and control signal to let the latch units alternate write and verify operations on the memory cells, and data latched by the memory cells during a verify operation may be used as write data in a next write operation. If data is sufficiently written in an objective memory cell of the specified memory cells by n write operations, an additional (n+1)-th write operation may be stopped to the objective memory cell in the following write operations for sufficiently writing data in the other memory cells of the specified memory cells. The nonvolatile semiconductor memory may further comprise a unit for determining whether or not data have been successfully written into all of the specified memory cells, and if the data have been successfully written, providing an affirmative output to terminate the alternate write and verify operations.

Further, according to the present invention there is also provided a nonvolatile semiconductor memory having a plurality of bit lines, a plurality of word lines, and a plurality of memory cells each provided at an intersection of each of the bit lines and each of the word lines. The memory comprises a plurality of latch units each provided for a corresponding bit line; a plurality of first switch units each arranged between corresponding latch unit and bit line; and a control circuit for supplying a first switch control signal to the first switch units and a control voltage and control signal to the latch units, the control voltage, control signal, and first switch control signal being used to carry out erase and write operations on the memory cells.

The nonvolatile semiconductor memory may further comprise a plurality of second switch units commonly receiving a second switch control signal from the control circuit, the latch units being connected to a column selection unit through the corresponding second switch units. The nonvolatile semiconductor memory may further comprise a plurality of third switch units arranged between a bit voltage control line and the bit lines and controlled by a third switch control signal, to speedily set the level of each of the bit lines to a predetermined level in a verify operation.

The control circuit may have a voltage controller for controlling the control voltage supplied to the latch units. The nonvolatile semiconductor memory may further comprise a first detection unit for detecting whether or not all of the latch units have been set to a first state ("0") to indicate that the memory cells of a selected page have been erased. The nonvolatile semiconductor memory may further comprise a second detection unit for detecting whether or not data of second state ("1") selectively held in the latch units have been successfully written into corresponding memory cells.

The first detection unit and second detection unit may be arranged in the control circuit, and the control circuit determines whether or not an erase operation or a write operation is complete. A node of drains of first transistors of the latch units provides a first signal to the second detection units, and a node of drains of second transistors of the latch units provides a second signal to the first detection unit.

The latch units may have third transistors switched in response to the common control signal to set data in the latch units by letting the second switch units be conductive and by transferring data of second state ("1") from a data bus. The nonvolatile semiconductor memory may further comprise a current detection unit for detecting a current flowing to the latch units, where an output of the current detection unit is used to determine whether or not a write operation is complete.

The nonvolatile semiconductor memory may be a flash memory that applies a positive high voltage to one of the word lines in an erase operation in order to inject electrons into a floating gate of each memory cell connected to the word line by tunnel effect, to thereby make the memory cells nonconductive, and applies a negative voltage to the word line and a positive voltage selectively to the bit lines in a write operation in order to draw electrons from the floating gates of selected memory cells using the tunnel effect, to thereby make the memory cells conductive.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments of the present invention, the problems of the prior art will be explained.

Figure 1A:
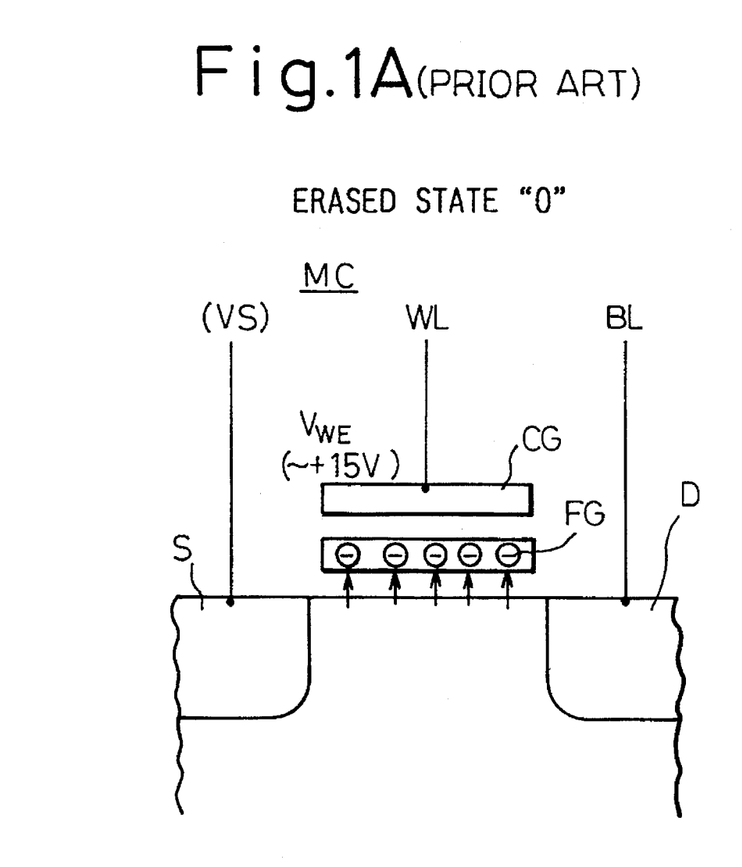
FIGS. 1A and 1B are diagrams for explaining an erased state and a programmed or written state of a memory cell in a nonvolatile semiconductor memory according to the prior art.
Figure 1B:
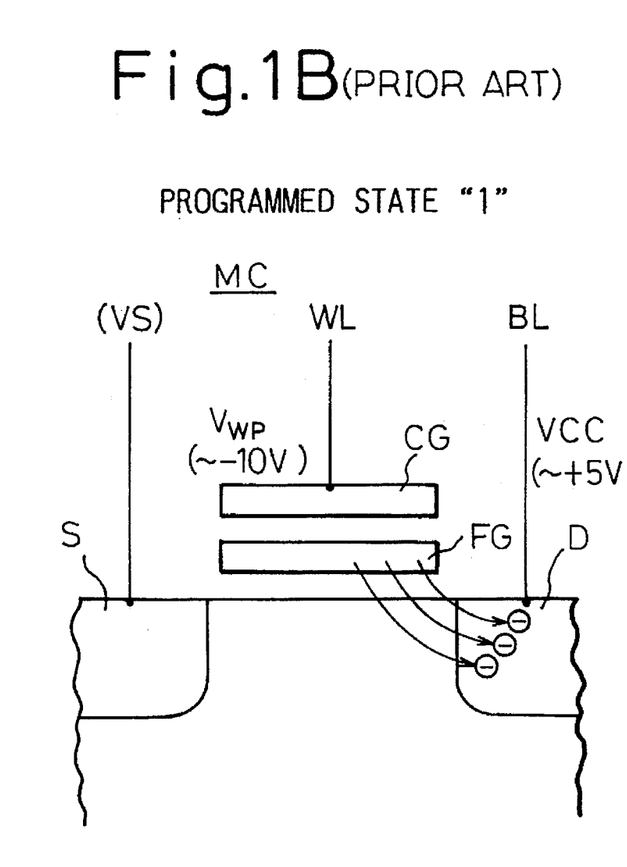

FIGS. 1A and 1B show a nonvolatile semiconductor memory according to the prior art. This memory writes data into its memory cells by using the tunnel effect. FIG. 1A shows an erased state of a memory cell MC. Under the erased state, the memory cell stores data of 0. FIG. 1B shows a programmed state, i.e., a written state of the memory cell. Under this state, the memory cell stores data of 1. The memory cell MC has a control gate CG, a floating gate FG, a source S, and a drain D. The memory cell MC is connected to a word line WL, a bit line BL, and a source line VS.

To erase data from the memory cell MC in FIG. 1A, a high voltage VWE of, for example, +15 V is applied to the word line WL, to cause the tunnel effect to inject electrons into the floating gate FG. Then, the memory cell MC is put in a nonconductive state to hold "0."

To write "1" into the memory cell MC in FIG. 1B, a negative voltage VWP of, for example −10 V is applied to the word line WL, and a positive voltage Vcc of, for example, +5 V is applied to the drain D through the bit line BL. The drain D draws electrons from the floating gate FG due to the tunnel effect, and the memory cell MC holds "1." The positive voltage Vcc is not applied to bit lines connected to the drains of memory cells into which "1" is not written. The floating gates of these memory cells, therefore, hold electrons as they are, to hold "0."

The tunnel-effect flash memory writes data page with each page containing 512 bytes. It is necessary for the flash memory to equalize the threshold voltage Vth of each memory cell into which data has been written. To achieve this, a write operation and a verify operation are alternately repeated in order to gradually strengthen the written state until the threshold voltage Vth is obtained. To speedily complete a write operation in the flash memory, it is important to shorten the verify operation before the write operation. It is also important to shorten the verify operation before an erase operation which is carried out before the write operation.

The verify operation reads data out of a memory cell, compares the data with original write or erase data, repeats a write or erase operation if the data has not been satisfactorily written or erased, and if the data has been satisfactorily written or erased, terminates the operation. In this way, the verify operation equalizes the threshold voltage Vth of each memory cell into which data has been written, or from which data has been erased. A circuit for carrying out the verify operation is complicated with many signal lines and elements. Accordingly, the nonvolatile semiconductor memory employing such a verify circuit involves a long write (programming) period and is expensive.

Next, preferred embodiments of the present invention will be explained with reference to the drawings.

Figure 2:
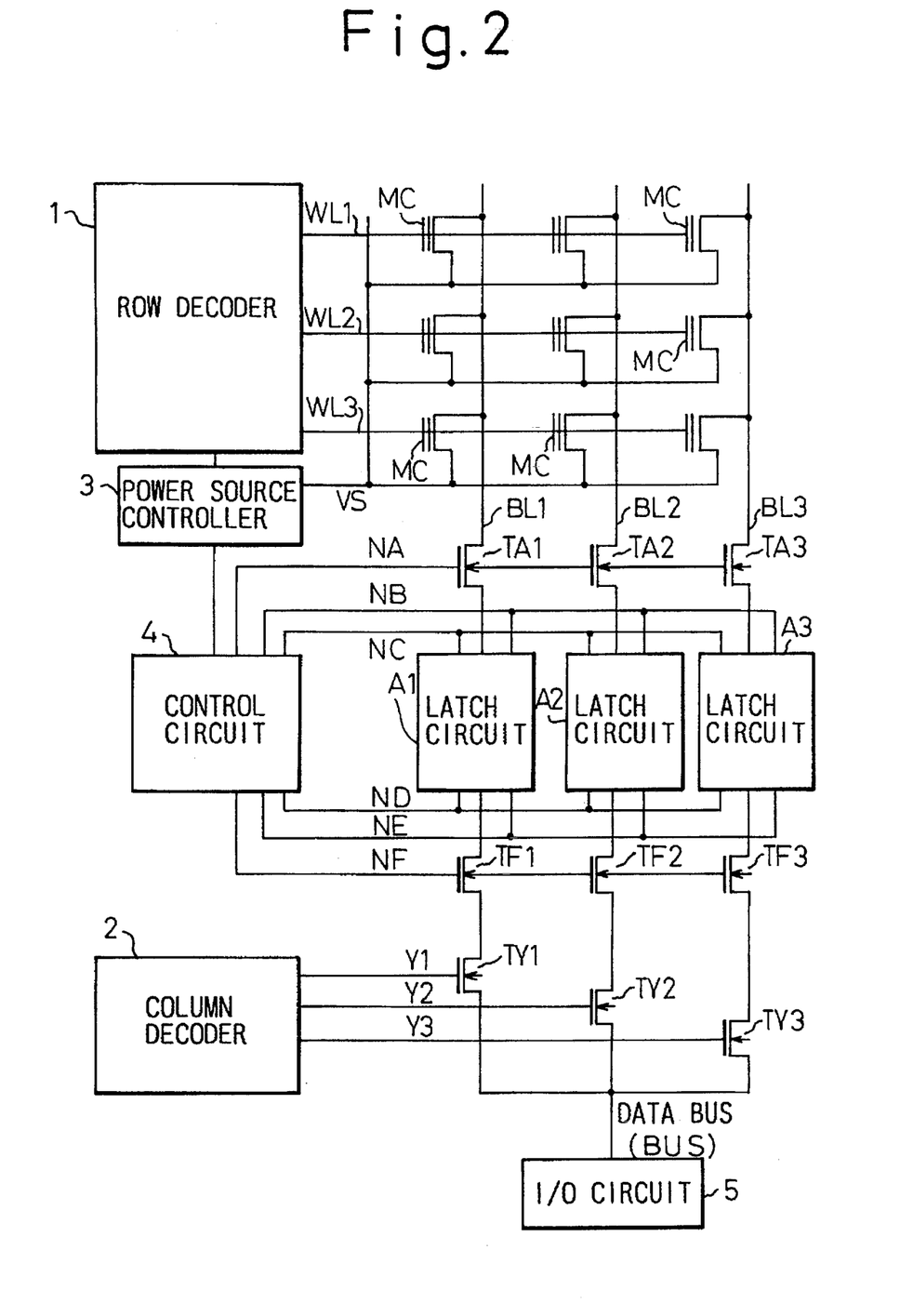
FIG. 2 is a block diagram showing a nonvolatile semiconductor memory according to an embodiment of the present invention.

FIG. 2 is a block diagram showing a nonvolatile semiconductor memory or a flash memory according to an embodiment of the present invention. The memory has a row decoder 1, a column decoder 2, a source power controller 3, a control circuit 4, an I/O circuit 5, and latch circuits A1 to A3. The memory also has bit lines BL1 to BL3, word lines WL1 to WL3, and memory cells MC. The memory uses tunnel effect to write data into the memory cells as in the prior art shown in FIGS. 1A and 1B.

Although the embodiment of FIG. 2 has three bit lines and three word lines to simplify the explanation, an actual flash memory has many bit and word lines. Memory cells connected to a word line form a page.

The flash memory of FIG. 2 has the bit lines BL1 to BL3, word lines WL1 to WL3, and the memory cells MC formed at the intersections of the bit and word lines. The bit lines BL1 to BL3 are connected to the latch circuits A1 to A3, respectively, through gate transistors TA1 to TA3 serving as switches. The output of the I/O circuit 5 is supplied to the latch circuits A1 to A3 through column gate transistors TY1 to TY3 and gate transistors (switches) TF1 to TF3, respectively. The column gate transistors TY1 to TY3 are switched in response to the outputs Y1 to Y3 of the column decoder 2, respectively. The gate transistors TA1 to TA3 and TF1 to TF3 are switched in response to output signals NA and NF from the control circuit 4. The control circuit 4 supplies a control voltage NB and a control signal NC to the latch circuits A1 to A3. The latch circuits A1 to A3 supply detective signals ND and NE to the control circuit 4.

The bit lines BL1 to BL3 are connected to the latch circuits A1 to A3 through the gate transistors TA1 to TA3, respectively. The control signal NA of the control circuit 4 is supplied to the gates of the gate transistors TA1 to TA3.

In a write operation, the control voltage NB of the control circuit 4 will be a write voltage of +5 V applied to the drain of each specified memory cell, and in a read operation, a read voltage of +1 V applied to the drain of each specified memory cell. In an erase operation, a positive voltage of +15 V is applied to a selected word line, to inject electrons into the floating gate of each memory cell, connected to the selected word line, using the tunnel effect. The memory cells connected to the selected word line form a page. In a write operation, a negative high voltage of −10 V is applied to a selected word line, and a positive intermediate voltage of +5 V is applied to the bit lines of selected memory cells, to draw electrons from the floating gate of each of the selected memory cells to the drain thereof.

This embodiment connects the bit lines BL1 to BL3 to the latch circuits A1 to A3 through the gate transistors TA1 to TA3, respectively, and supplies the control signal NA to the gates of the gate transistors TA1 to TA3. Any latch circuit corresponding to a memory cell into which data of "1" is going to be written latches data for writing "1" into the memory cell in advance. Thereafter, a word line is selected, and a write operation, i.e., a programming operation is simultaneously carried out on all memory cells connected to the selected word line.

The voltage of the latch circuit corresponding to the memory cell into which "1" is going to be written is applied to the bit line to which the latch circuit is connected through the gate transistor. Namely, the write operation is carried out only on selected memory cells. After the write operation, a verify operation is carried out with a proper positive voltage being continuously applied to the selected word line and the latch circuits holding the latched data. The verify operation is simultaneously carried out on all the memory cells connected to the selected word line.

If data has been sufficiently written in a given memory cell, the memory cell will be ON in the verify operation, and a current flowing to the memory cell will invert the latched data in the corresponding latch circuit into "0." While any one of the latch circuits is holding latched data, the negative high voltage is applied to the selected word line, to repeat the write operation. Namely, the write operation is repeated only on memory cells into which data have been insufficiently written. The write and verify operations are alternated several times, to equalize the threshold voltages Vth of the written memory cells. The verify operation is speedily completed because it is carried out collectively on the memory cells connected to the selected word line.

A read operation resembles the verify operation. A voltage VWRP (VWRE) of +5 V is applied to a selected word line. The control signal NA is raised to turn ON the gate transistors TA1 to TA3. Data in memory cells connected to the selected word line are latched by the latch circuits A1 to A3 through the bit lines BL1 to BL3 and gate transistors TA1 to TA3. The control signal NF is raised to turn ON the gate transistors TF1 to TF3. The column decoder 2 sequentially switches the column transistors TY1 to TY3, to send the latched data to a data bus and the I/O circuit 5. Unlike the prior art, this embodiment requires no sense circuits to read data.

As explained above, each latch circuit of the nonvolatile semiconductor memory (flash memory) of the present invention stores the result of a verify operation carried out on a corresponding memory cell. The stored result is used as a bias value for the next write operation. Namely, a write operation is automatically repeated until each specified memory cell becomes conductive to change data in the corresponding latch circuit.

Figure 3:
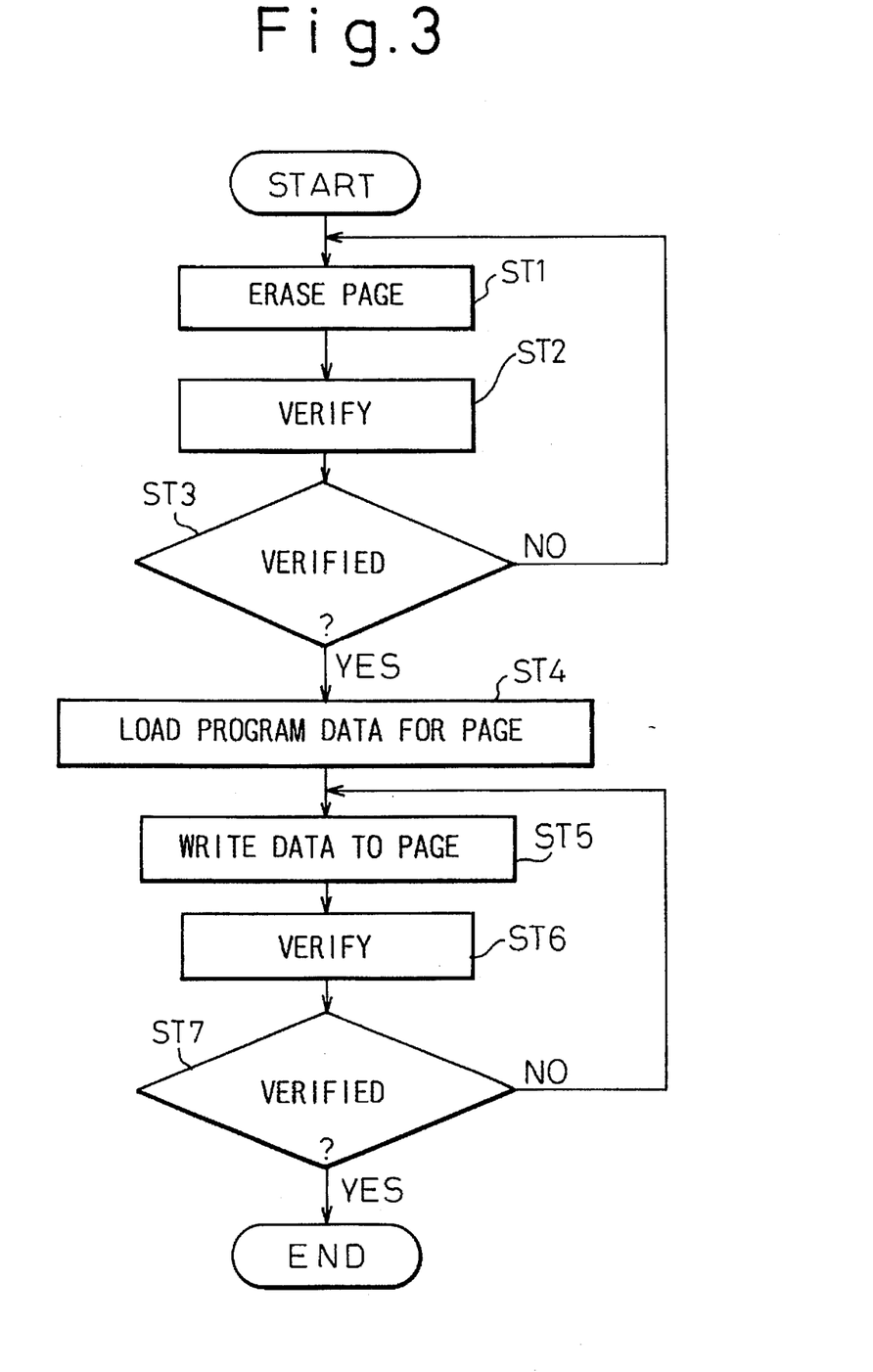
FIG. 3 is a flowchart explaining an algorithm for writing data into the memory of FIG. 2.
Figure 4:
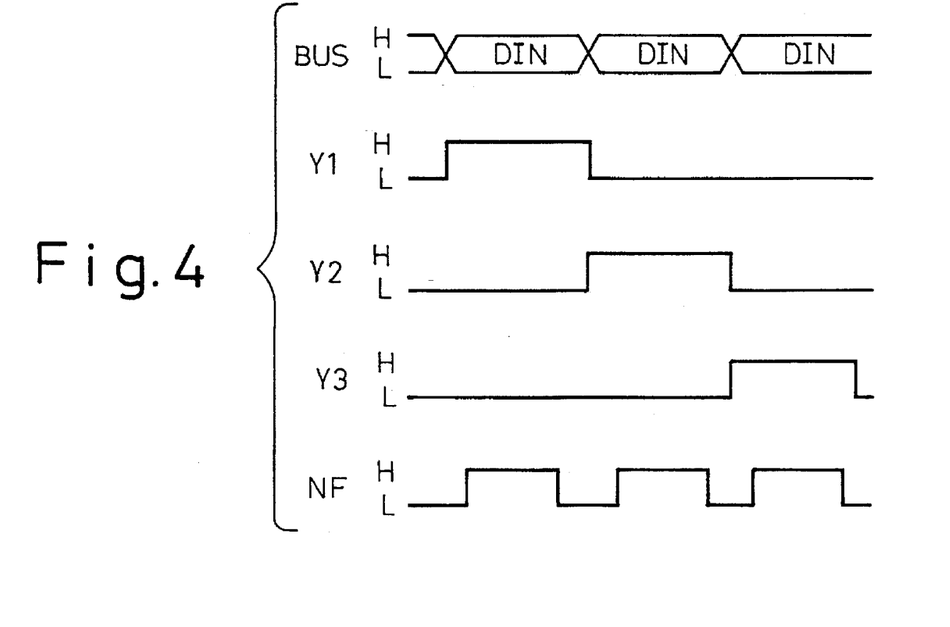
FIG. 4 is a timing chart showing an operation of writing data into the memory of FIG. 2.

FIG. 3 is a flowchart for writing data into specified memory cells in the nonvolatile semiconductor memory of FIG. 2. FIG. 4 explains the operation of loading data to the nonvolatile semiconductor memory of FIG. 2.

Step ST1 simultaneously erases a page of memory cells connected to a selected word line WL. A positive high voltage VWE of +15 V is applied to the control gate CG of every memory cell of the page connected to the selected word line. As a result, electrons are injected into the floating gate FG of each of the memory cells in question due to tunnel effect, and the memory cells become nonconductive. Namely, data "0" is written into these memory cells.

Step ST2 carries out an erase verify operation collectively on the memory cells of the page. Step ST3 determines whether or not the page has been properly erased. If it is unsatisfactorily erased, the step ST1 is repeated, and if it is satisfactorily erased, step ST4 is carried out. The details of this operation will be explained later, in detail, with reference to FIG. 6.

Step ST4 simultaneously loads data to be written into specified memory cells in the page. The outputs Y1 to Y3 of the column decoder 2 of FIG. 4 are successively raised to successively select the column gate transistors TY1 to TY3. At the same time, the control signal NF to the gate transistors TF1 to TF3 is raised. As a result, the data to be written are sequentially transmitted from the I/O circuit 5 to the data bus and are latched by the latch circuits A1 to A3.

Step ST5 simultaneously writes the data into the specified memory cells of the page. Step ST6 collectively carries out a write verify operation on the memory cells. Step ST7 determines whether or not the data have been successfully written into the memory cells. If they have not been successfully written, the step ST4 is repeated, and if they have, the operation ends. The details of this operation will be explained later with reference to FIG. 7.

Figure 5:
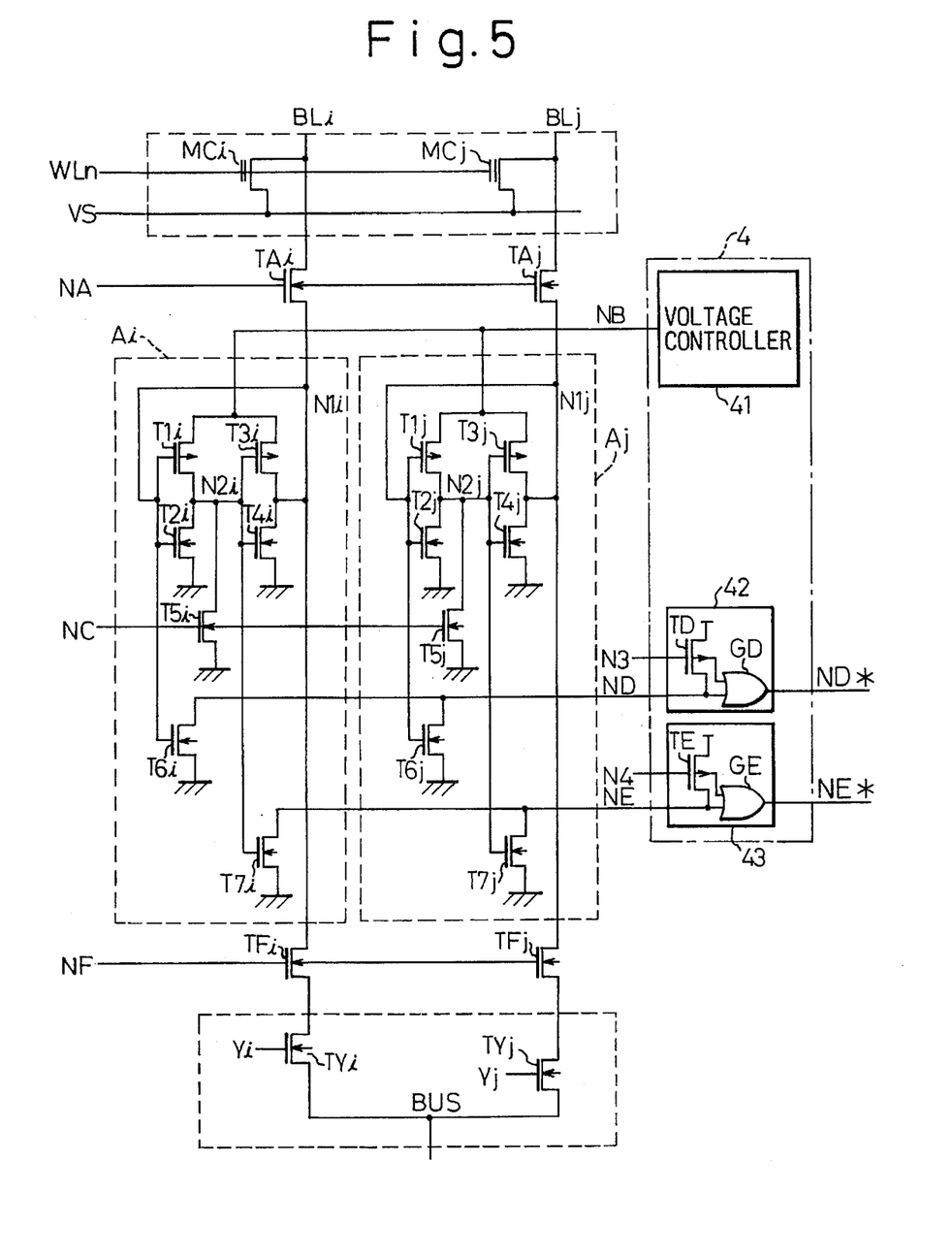
FIG. 5 is a circuit diagram showing the memory of FIG. 2.

FIG. 5 shows the details of the nonvolatile semiconductor memory of FIG. 2. FIG. 5 shows two optional latch circuits Ai and Aj among the latch circuits of FIG. 2. The latch circuit Ai consists of p-channel MOS transistors T1i and T3i and n-channel MOS transistors T2i, T4i, T5i, T6i, and T7i. The latch circuit Aj consists of p-channel MOS transistors T1j and T3j and n-channel MOS transistors T2j, T4j, T5j, T6j, and T7j. The transistors T1i and T2i (T1j and T2j) form a first inverter. The transistors T3i and T4i (T3j and T4j) form a second inverter. The first and second inverters form a flip-flop circuit. An input terminal of the first inverter, i.e., an output terminal of the second inverter is a node N1i (N1j). An input terminal of the second inverter, i.e., an output terminal of the first inverter is a node N2i (N2j).

The control circuit 4 has a voltage controller 41 for controlling the voltage NB applied to the latch circuits Ai and Aj, an erased-state detector 43 for receiving the detective signal NE from the latch circuits Ai and Aj, to detect an erased state "1" of every memory cell of a given page, and a written-state detector 42 for receiving the detective signal ND from the latch circuits Ai and Aj, to detect a written state "0" of every memory cell of a given page. The structure of the erased-state detector 43 is the same as that of the written-state detector 42. The erased-state detector 43 has a transistor TE and an OR gate GE. The written-state detector 42 has a transistor TD and an OR gate GD.

The voltage NB of the voltage controller 41 is applied to the sources of the transistors T1i, T3i, T1j, and T3j of the latch circuits Ai and Aj. The control signal NC is applied to the gates of the transistors T5i and T5j whose drains are connected to the nodes N2i and N2j, respectively. The signal ND is provided from the drains of the transistors T6i and T6j whose gates are connected to the nodes N1i and N1j, respectively. The signal NE is provided from the drains of the transistors T7i and T7j whose gates are connected to the nodes N2i and N2j, respectively.

The drains of the memory cells MCi and MCj are connected to the bit lines BLi and BLj, respectively. The gate transistor TAi serving as a first switch is arranged in the bit line BLi between the drain of the memory cell MCi and the node N1i. The gate transistor TAj serving as another first switch is arranged in the bit line BLj between the drain of the memory cell MCj and the node N1j. The gate transistors TAi and TAj are controlled by the first switch control signal NA provided by the control circuit 4. The column decoder 2 supplies the signals Yi and Yj to control the column transistors TYi and TYj. The gate transistor TFi serving as a second switch is arranged between the drain of the column transistor TYi and the node N1i of the latch circuit Ai. The gate transistor TFj serving as another second switch is arranged between the drain of the column transistor TYj and the node N1j of the latch circuit Aj. The gate transistors TFi and TFj are controlled by the second switch control signal NF provided by the control circuit 4.

Figure 6:
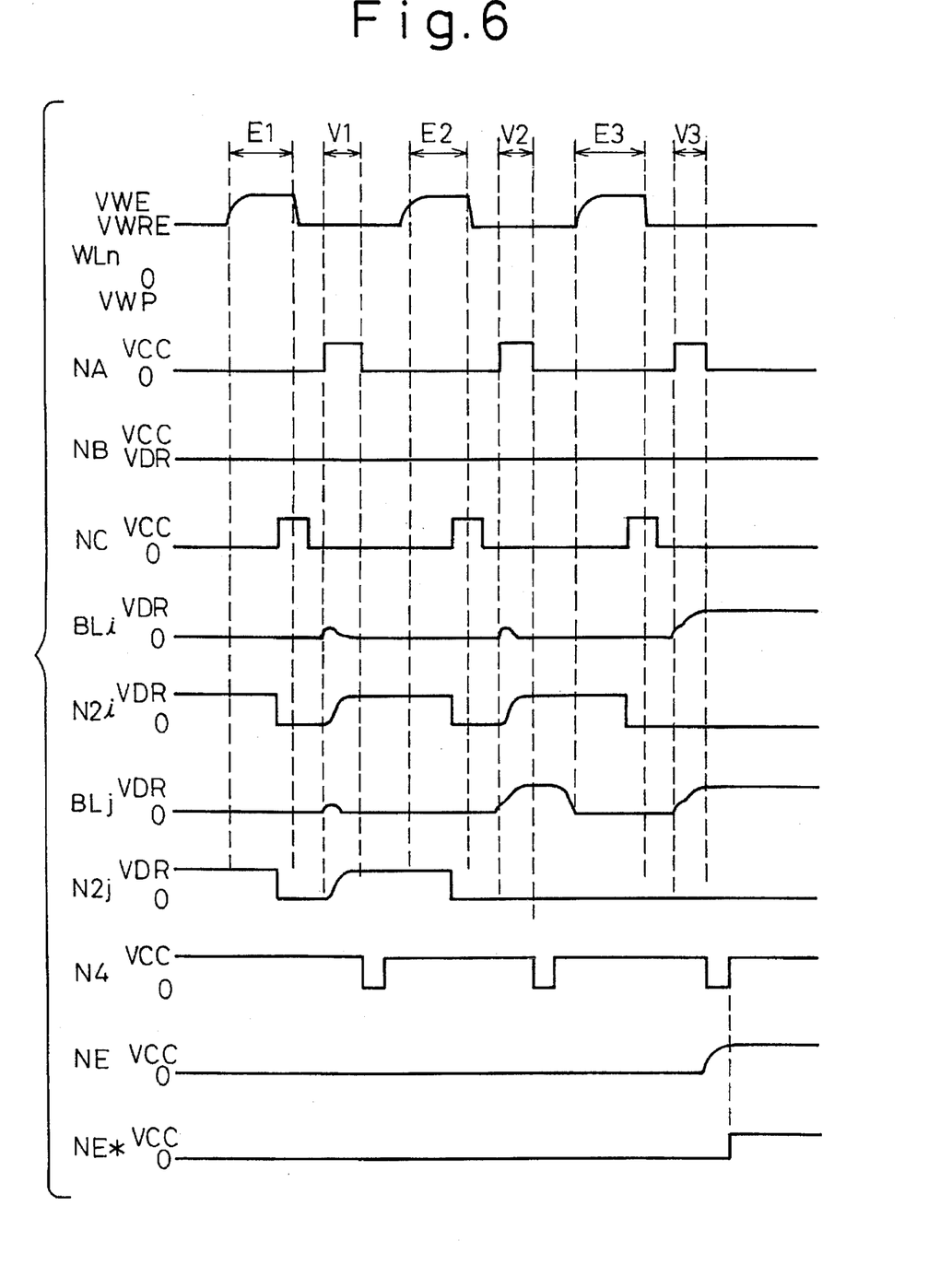
FIG. 6 is a timing chart showing an erase operation and an erase verify operation of the memory of the present invention.

FIG. 6 is a timing chart explaining the erase operations and the erase verify operations carried out in the nonvolatile semiconductor memory according to the present invention.

As explained with reference to FIG. 3, an erase operation is carried out by applying a positive voltage VWE of +15 V to a selected word line WLn. The voltage VWE in the selected word line is applied to the control gate CG of every memory cell (MCi, MCj) of a page connected to the selected word line. Due to the tunnel effect, electrons are injected into the floating gate FG of each memory cell of the page. FIG. 6 shows that the first erase operation E1 is unable to put the memory cells MCi and MCj in a completely nonconductive state, i.e., unable to write data of "0" to every memory cell of the page.

The control signal NC is set to high level (Vcc) to turn ON the transistors T5i and T5j of the latch circuits Ai and Aj. As a result, the levels of the nodes N2i and N2j, i.e., the inverted levels of the nodes N1i and N1j of the latch circuits Ai and Aj each become 0 V (ground level).

A nonselected voltage VWER is applied to the word line WLn. The control signal NC is set to low level (0 V) to turn OFF the transistors T5i and T5j. The first switch control signal NA is set to a high level to turn ON the gate transistors (first switches) TAi and TAj. As a result, the bit lines BLi and BLj are connected to the nodes N1i and N1j of the latch circuits Ai and Aj, respectively, and charges accumulated in the transistors T1i to T4i and T1j to T4j of the latch circuits Ai and Aj are supplied to the bit lines BLi and BLj. This is the first verify operation V1. The control voltage NB is always at a voltage VDR of, for example, +1 V.

The control signal NA is set to low level to turn OFF the gate transistors TAi and TAj and to carry out the second erase operation E2. Thereafter, the second verify operation V2, third erase operation, and third verify operation V3 are successively carried out.

In FIG. 6, data in the memory cell MCj connected to the bit line BLj is completely erased by the second erase operation E2. Data in the memory cell MCi connected to the bit line BLi is completely erased by the third erase operation E3.

When the memory cell MCj is sufficiently erased, i.e., when "0" is successfully written in the memory cell MCj by the second erase operation E2, the memory cell MCj will be OFF in the second verify operation V2, so that the potential of the bit line BLj is equal to the potential VDR of the control voltage NB. Accordingly, the node N2j of the latch circuit Aj is 0 V. At this time, the memory cell MCi is insufficiently erased. Accordingly, the memory cell MCi is ON in the second verify operation V2, and a current flows from the bit line BLi to the memory cell MCi. As a result, the potential of the bit line BLi will be 0 V. The third erase operation E3 completely erases the data in the memory cell MCi. Similarly to the memory cell MCj after the second erase operation E2, the memory cell MCi becomes OFF in the third verify operation V3, and the potential of the bit line BLi is equal to the control voltage NB. Consequently, the node N2i of the latch circuit Ai becomes 0 V.

Once the data in the memory cells MCi and MCj are sufficiently erased, the level of each of the nodes N2i and N2j of the latch circuits Ai and Aj is kept at a low level. When all of the memory cells of the selected page are sufficiently erased, the erased-state detecting transistors T7i and T7j of the latch circuits Ai and Aj are turned OFF. When a control signal N4 is set to a low level, an erase completion detective signal (a second detective signal) NE (NE*) is set to high level.

Figure 7:
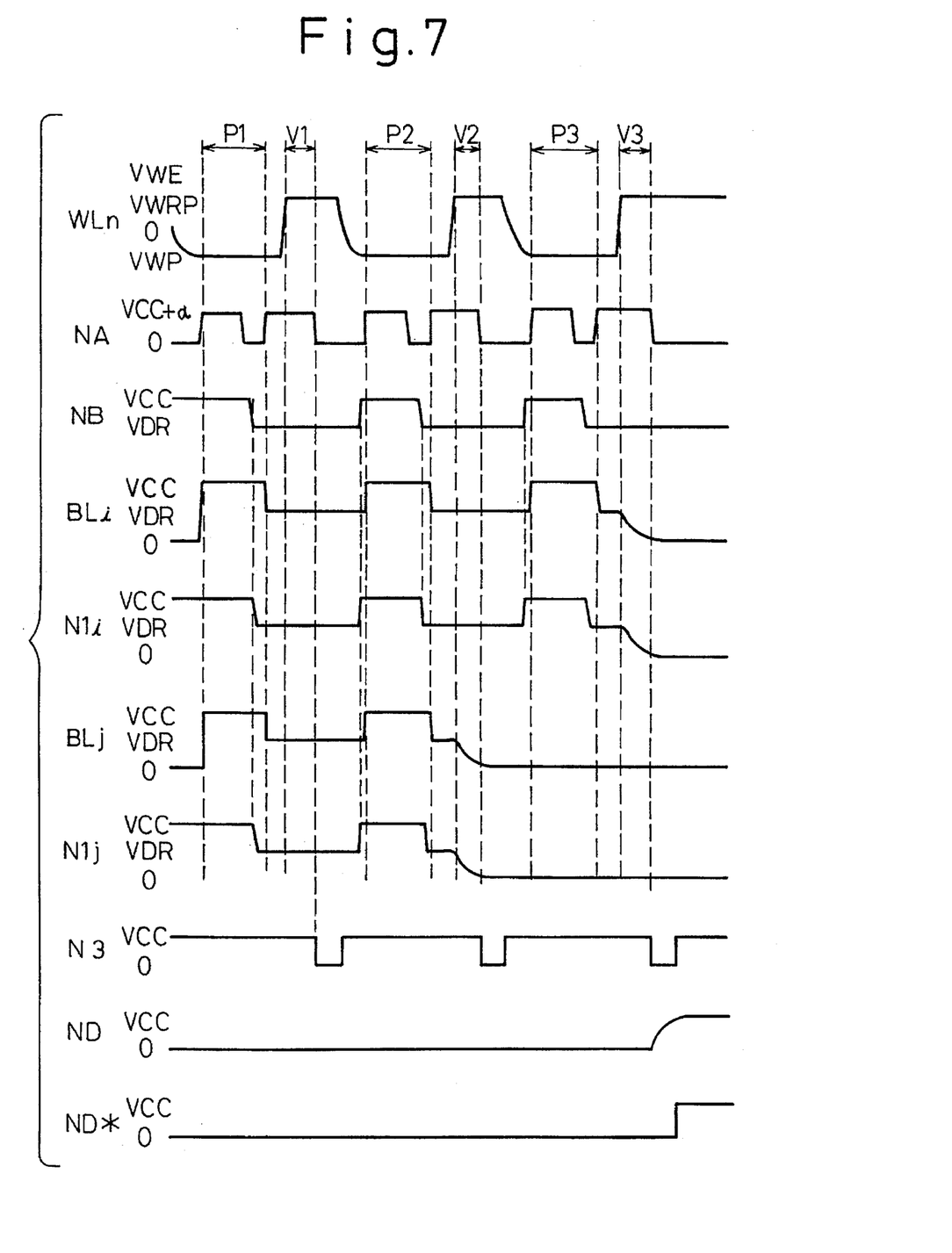
FIG. 7 is a timing chart showing a write operation and a write verify operation of the memory of the present invention.

FIG. 7 is a timing chart explaining a programming operation, i.e., a write operation and a program verify operation, i.e., a write verify operation carried out in the nonvolatile semiconductor memory of the present invention.

As explained with reference to FIG. 3, the programming operation is started by selecting an optional word line WLn. A negative voltage VWP of, for example, −10 V is applied to the selected word line WLn. At the same time, a positive voltage Vcc of, for example, +5 V is selectively applied to the drain D of each specified memory cell through a corresponding bit line (BLi, BLj). In programming operations P1, P2, and P3, the control voltage NB is set to the voltage Vcc, and the control signal NA is set to a high level of "Vcc+a," to turn ON the gate transistors TAi and TAj. As a result, the voltage Vcc is applied to the bit lines BLi and BLj. At this time, the levels of the nodes N1i and N1j of the latch circuits Ai and Aj are each set to the voltage Vcc.

The control voltage NB is set to a voltage VDR of, for example, +1 V if it is not the programming operation. As explained with reference to FIG. 4, write data are supplied from the I/O circuit 5 to the latch circuits Ai and Aj, respectively, in advance. A positive voltage is selectively applied to bit lines corresponding to the memory cells into which the data are going to be written. In the example of FIG. 7, data "1" is going to be written into each of the memory cells MCi and MCj.

The control signal NA is set to low level to turn OFF the gate transistors TAi and TAj and the control voltage NB to the voltage VDR. As a result, the levels of the nodes N1i and N1j of the latch circuits Ai and Aj are each set to the voltage VDR. The control signal NA is again set to the high level of "Vcc+a" to turn ON the gate transistors TAi and TAj, to thereby apply the voltage VDR to the bit lines BLi and BLj. At this time, a voltage VWRP of, for example, +5 V is applied to the word line WLn, to carry out a first program verify operation V1.

The control signal NA is set to low level to turn OFF the gate transistors TAi and TAj, and the level of the word line WLn to the negative voltage VWP, to thereby carry out the second programming operation P2, similar to the first programming operation P1. Thereafter, the second verify operation V2, third programming operation P3, and third verify operation V3 are successively carried out.

In FIG. 7, the programming of the memory cell MCj connected to the bit line BLj is completed by the second programming operation P2. The programming of the memory cell MCi connected to the bit line BLi is completed by the third programming operation P3.

When "1" is sufficiently written into the memory cell MCj in the second programming operation P2, i.e., when the writing operation on the memory cell MCj is sufficient to bring the threshold voltage Vth of the memory cell to a predetermined value, the memory cell MCj will be ON in the second verify operation V2. Accordingly, a current flows from the bit line BLj to the memory cell MCj, to zero the potential of the bit line BLj, i.e., the potential of the node N1j. At this time, the memory cell MCi is insufficiently written, and therefore, it is OFF in the second verify operation V2. Accordingly, the potential of the bit line BLi is kept at the voltage VDR. The memory cell MCi is sufficiently written and turned ON in the third programming operation P3. As a result, a current flows from the bit line BLi to the memory cell MCi, to zero the potential of the bit line BLi, i.e., the potential of the node N1i.

When the programming of the memory cells MCi and MCj corresponding to the latch circuits Ai and Aj is complete, i.e., when "1" is successfully written into these memory cells, the levels of the nodes N1i and N1j of the latch circuits Ai and Aj are each kept at a low level. When the programming of the memory cells of the selected page is complete, the written-state detecting transistors T6i and T6j of the latch circuits Ai and Aj are each OFF. In any latch circuit corresponding to a memory cell into which "1" is not written, i.e., a memory cell that keeps "0," the written-state detecting transistor T6 thereof is always OFF. When a control signal N3 is set to low level, a program completion detective signal (a first detective signal) ND (ND*) is set to high level.

A read operation carried out on a selected word line resembles the verify operation. Namely, a voltage VWRP (VWRE) of, for example, +5 V is applied to the selected word line. The control signal NA is set to high level to turn ON the gate transistors TAi and TAj, so that data in memory cells of the page connected to the selected word line are latched by the latch circuits Ai and Aj, respectively, through the bit lines BLi and BLj and gate transistors TAi and TAj. The control signal NF is raised to sequentially switch the column transistors TYi and TYj, to read the data through the data bus.

Figure 8:
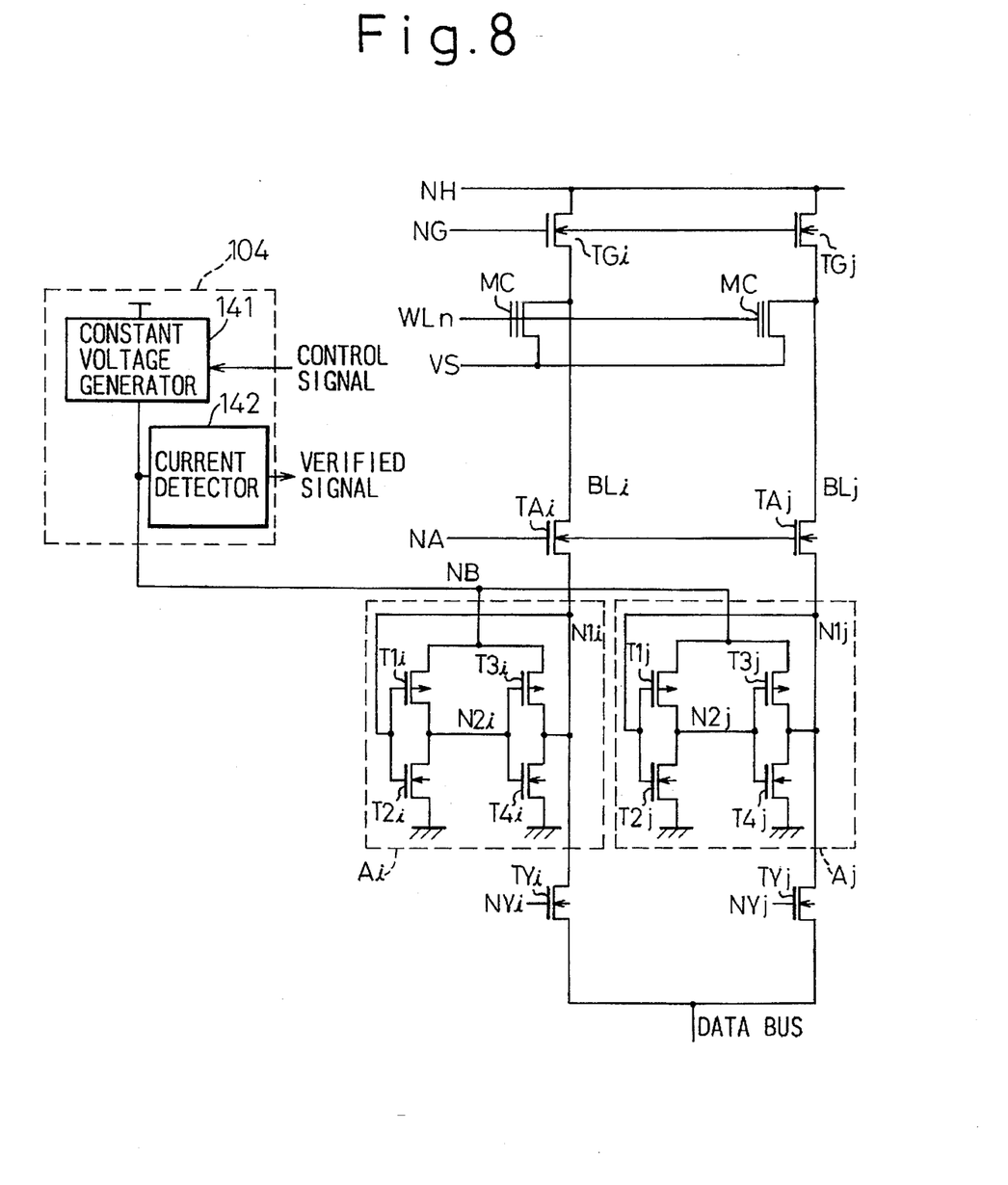
FIG. 8 is a circuit diagram showing a nonvolatile semiconductor memory according to another embodiment of the present invention.

FIG. 8 is a circuit diagram showing a nonvolatile semiconductor memory according to another embodiment of the present invention. This memory has a control circuit 104, a constant voltage generator 141, and a current detector 142. The memory involves a control voltage NH for a bit voltage control line, and a control signal NG.

The control voltage NH is supplied to bit lines BLi and BLj through gate transistors TGi and TGj that are controlled by the control signal NG. The written-state detector 42, erased-state detector 43, and the transistors T5i, T5j, T6i, T6j, T7i, and T7j of the latch circuits Ai and Aj of FIG. 5 are not arranged in FIG. 8. Namely, latch circuits Ai and Aj of FIG. 8 include flip-flop circuits that simply consist each of four transistors (two inverters).

The current detector 142 detects a current passing through all the latch circuits Ai and Aj, to determine whether or not a write operation has been completed, and provides a verify pass signal. If predetermined data has been successfully written in a specified memory cell, a current flowing to the corresponding latch circuit decreases. Accordingly, when predetermined data have been written into all specified memory cells in a selected page, the current detector 142 provides the verify pass signal to terminate the write operation. The constant voltage generator 141 switches a voltage Vcc of +5 V and a voltage VDR of +1 V from one to another, and supplies one of them as a control voltage NB to the latch circuits Ai and Aj.

The control signal NG controls the gate transistors TGi and TGj, which speedily set the levels of the bit lines BLi and BLj to the level VDR in a verify operation.

Figure 9:
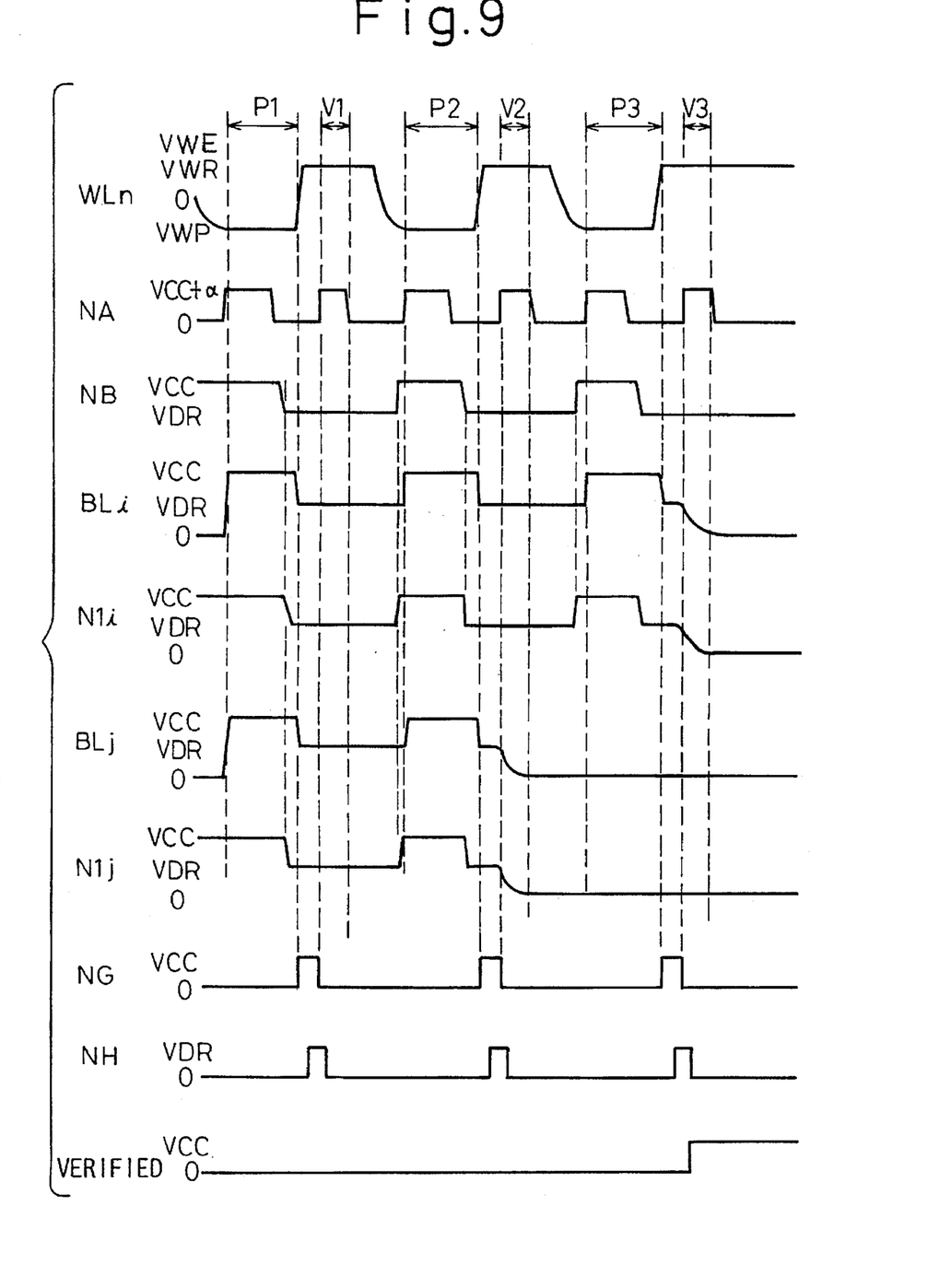
FIG. 9 is a timing chart showing a write operation and a write verify operation of the memory of FIG. 8.

FIG. 9 is a timing chart explaining the programming and program verify operations, i.e., write and write verify operations of the nonvolatile semiconductor memory of FIG. 8.

The operations of FIG. 9 are basically the same as those of FIG. 7. In FIG. 9, the level of a selected word line WLn is increased from a voltage VWP to a voltage VWR just after each of programming operations P1, P2, and P3. At the same time, the control signal NG is increased to high level (Vcc) to turn ON the gate transistors TGi and TGj. The control voltage NH is increased from 0 V to the voltage VDR to speedily set the potential of the bit lines BLi and BLj to the voltage VDR. In this way, the embodiment of FIGS. 8 and 9 is capable of more speedily carrying out a programming operation, i.e., a write operation than the embodiment of FIGS. 5 and 7.

As explained above, the output voltage (control voltage) NB of the constant voltage generator 141 serves as the voltage Vcc in a write operation and the voltage VDR in a verify operation. The current detector 142 detects a current flowing from the constant voltage generator 141 to the latch circuits Ai and Aj, and if the current is smaller than a predetermined value, increases the verify pass signal from 0 V to the voltage Vcc, to thereby signal of the completion of a programming operation on specified memory cells of a given page.

In this way, the nonvolatile semiconductor memory according to this embodiment is capable of collectively carrying out a write verify operation when write and write-verify operations are alternated several times. This embodiment carries out the write operation at a high speed, to improve the operation speed of the memory and simplifies the structure of the memory.

As explained above in detail, the nonvolatile semiconductor memory according to the present invention is simple, can easily and speedily carry out a programming operation, i.e., a write operation, and is inexpensive.

Many different embodiments of the present invention may be constructed without departing from the spirit and scope of the present invention, and it should be understood that the present invention is not limited to the specific embodiments described in this specification, except as defined in the appended claims.

What is claimed is:

1. A nonvolatile semiconductor memory having a plurality of bit lines, a plurality of word lines, and a plurality of memory cells each provided at an intersection of each of said bit lines and each of said word lines, comprising:

a plurality of latch means each provided for a corresponding bit line; and a control circuit for supplying a control voltage and a control signal to said latch means for operating said latch means as a means for simultaneously biasing voltages applied to first electrodes of specified ones of said memory cells through said bit lines during a write operation, to simultaneously write data into said specified memory cells, and during a read operation, as a means for simultaneously reading data out of said memory cells.

2. A nonvolatile semiconductor memory as claimed in claim 1, wherein each of the first electrodes of said specified memory cells is a drain electrode of a memory cell transistor forming each of said memory cells.

3. A nonvolatile semiconductor memory as claimed in claim 1, wherein said control circuit provides the control voltage and control signal permitting said latch means to alternate write and verify operations on said memory cells, and data latched by said memory cells during a verify operation are used as write data in a next write operation.

4. A nonvolatile semiconductor memory as claimed in claim 3, wherein, if data is sufficiently written in an objective memory cell of said specified memory cells by n write operations, an additional (n+1)-th write operation is stopped to said objective memory cell in the following write operations for sufficiently writing data in the other memory cells of said specified memory cells.

5. A nonvolatile semiconductor memory as claimed in claim 3, wherein said nonvolatile semiconductor memory further comprises a means for determining whether or not data have been successfully written into all of said specified memory cells, and if the data have been successfully written, providing an affirmative output to terminate the alternate write and verify operations.

6. A nonvolatile semiconductor memory as claimed in claim 1, wherein said nonvolatile semiconductor memory comprises a flash memory for applying a positive high voltage to one of said word lines in an erase operation in order to inject electrons into a floating gate of each memory cell connected to said word line by tunnel effect thereby making said memory cells nonconductive, and for applying a negative voltage to said word line and a positive voltage selectively to said bit lines in a write operation in order to draw electrons from the floating gates of selected memory cells by tunnel effect, thereby making said memory cells conductive.

7. A nonvolatile semiconductor memory having a plurality of bit lines, a plurality of word lines, and a plurality of memory cells each provided at an intersection of each of said bit lines and each of said word lines, comprising:

a plurality of latch means each provided for corresponding bit line; and a plurality of first switch means each arranged between corresponding latch means and bit line; and a control circuit for supplying a first switch control signal to said first switch means and a control voltage and control signal to said latch means, the control voltage, control signal, and first switch control signal being used to carry out simultaneous erase and simultaneous write operations on said plurality of memory cells.

8. A nonvolatile semiconductor memory as claimed in claim 7, wherein said nonvolatile semiconductor memory further comprises a plurality of second switch means commonly receiving a second switch control signal from said control circuit, said latch means being connected to a column selection means through said corresponding second switch means.

9. A nonvolatile semiconductor memory as claimed in claim 8, wherein said nonvolatile semiconductor memory further comprises a plurality of third switch means arranged between a bit voltage control line and said bit lines and controlled by a third switch control signal, to speedily set the level of each of said bit lines to a predetermined level in a verify operation.

10. A nonvolatile semiconductor memory as claimed in claim 7, wherein said control circuit comprises a voltage controller for controlling the control voltage supplied to said latch means.

11. A nonvolatile semiconductor memory as claimed in claim 10, wherein said nonvolatile semiconductor memory further comprises a first detection means for detecting whether or not all of said latch means have been set to a first state to indicate that said memory cells of a selected page have been erased.

12. A nonvolatile semiconductor memory as claimed in claim 11, wherein said nonvolatile semiconductor memory further comprises a second detection means for detecting whether or not data of second state selectively held in said latch means have been successfully written into corresponding memory cells.

13. A nonvolatile semiconductor memory as claimed in claim 12, wherein said first detection means and said second detection means are arranged in said control circuit, and said control circuit determines whether or not an erase operation or a write operation is complete.

14. A nonvolatile semiconductor memory as claimed in claim 12, wherein a node of drains of first transistors of said latch means provides a first detection signal to said second detection means, and a node of drains of second transistors of the latch means provides a second detection signal to said first detection means.

15. A nonvolatile semiconductor memory as claimed in claim 7, wherein said latch means comprises third transistors switched in response to the common control signal to set data in said latch means by permitting said second switch means to be conductive and by transferring data of second state from a data bus.

16. A nonvolatile semiconductor memory as claimed in claim 7, wherein said nonvolatile semiconductor memory further comprises a current detection means for detecting a current flowing to said latch means, an output of said current detection means is used to determine whether or not a write operation is complete.

17. A nonvolatile semiconductor memory as claimed in claim 7, wherein said nonvolatile semiconductor memory is a flash memory for applying a positive high voltage to one of said word lines in an erase operation for injecting electrons into a floating gate of each memory cell connected to said word line by tunnel effect, to thereby make said memory cells nonconductive, and for applying a negative voltage to said word line and a positive voltage selectively to said bit lines in a write operation, to draw electrons from the floating gates of selected memory cells by tunnel effect, to thereby make said memory cells conductive.

* * * * *